United States Patent
Miyazawa et al.

(10) Patent No.: US 8,040,634 B2
(45) Date of Patent: Oct. 18, 2011

(54) MAGNETIC HEAD SUSPENSION

(75) Inventors: Hiroaki Miyazawa, Tokyo-to (JP); Terutoshi Momose, Tokyo-to (JP); Yoichi Hitomi, Tokyo-to (JP); Tsuyoshi Yamazaki, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 410 days.

(21) Appl. No.: 12/307,298

(22) PCT Filed: Jul. 14, 2006

(86) PCT No.: PCT/JP2006/314068
§ 371 (c)(1),
(2), (4) Date: Jan. 2, 2009

(87) PCT Pub. No.: WO2008/007439
PCT Pub. Date: Jan. 17, 2008

(65) Prior Publication Data
US 2009/0310260 A1    Dec. 17, 2009

(51) Int. Cl.
*G11B 5/48* (2006.01)
(52) U.S. Cl. .......... 360/234.5; 360/244; 360/245.8; 360/59
(58) Field of Classification Search .......... 360/234.5, 360/244, 245.8, 59
See application file for complete search history.

(56) References Cited

U.S. PATENT DOCUMENTS
7,205,484 B2 * 4/2007 Shiraishi et al. .............. 174/260

FOREIGN PATENT DOCUMENTS
| JP | 08-180353 A | 7/1996 |
| JP | 2004-164813 A | 6/2004 |
| JP | 2006-012205 A | 1/2006 |

OTHER PUBLICATIONS
International Search Report: PCT/JP2006/314068, Sep. 28, 2006.
* cited by examiner

*Primary Examiner* — Thong Q Le
(74) *Attorney, Agent, or Firm* — Ladas & Parry LLP

(57) ABSTRACT

A magnetic head suspension having a thin metallic plate as a substrate which is caused to have a new function besides a function as a spring. The magnetic head suspension plural lines for connecting a magnetic head and a control circuit board to each other are formed over a thin metallic plate having a spring property through an insulating layer, and are integrated with the thin metallic plate A metallic pad made of a same metal layer as the plural lines is formed independently of the lines, an opening is made in a portion of the metallic pad to penetrate the insulating layer and then to reach the thin metallic plate, and an electroconductive region is formed into the opening by metal plating, thereby connecting the metallic pad and the thin metallic plate electrically to each other. Thereby, the desired portions of the suspension can be grounded through this simple structure without adopting a complicated structure wherein additional special lines for grounding are not separately laid besides the lines, which are lines for connecting a magnetic head and a control circuit board to each other.

16 Claims, 5 Drawing Sheets

MAGNETIC HEAD SUSPENSION

TECHNICAL FIELD

The present invention belongs to a technical field of a magnetic head suspension assembly used in a hard disk drive (HDD), and relates particularly to a magnetic head suspension with which lines for connecting a magnetic head and a control circuit board to each other are formed to be integrated.

BACKGROUND ART

In recent years, due to the spread of the Internet and others, the information processing amount of personal computers and the processing speed of information have been required to be increased. Following to that, it has been requested that the capacity of hard disc drives (HDDs) integrated into personal computers and the speed of information transmission are made larger. The type of the component for supporting a magnetic head used in an HDD, which is called a magnetic head suspension, has also been shifting from a conventional type, to which signal lines such as gold wires are connected, to a wiring-integrated type, i.e., the so-called wireless suspension type, wherein signal lines such as copper wires are formed directly to a stainless steel spring.

As one out of processes for producing such a wiring-integrated type suspension, Japanese Patent Application Laid-Open No. 8-180353 discloses a process of using a laminated plate composed of a layer of a spring-property metal such as stainless steel, an insulating layer, and an electroconductive layer, patterning the spring-property metal layer and the electroconductive layer into a predetermined pattern, and then removing the insulating layer partially by plasma etching. This makes it possible to yield a magnetic head suspension wherein plural lines for connecting a magnetic head and a control circuit board to each other are formed on a thin metallic plate having the spring property so as to be integrated with the plate in the state that the insulating layer is interposed between the plate and the lines.

Patent Document: Japanese Patent Application Laid-Open No. 8-180353

DISCLOSURE OF THE INVENTION

Problems to be Solved by the Invention

As described above, magnetic head suspensions each have a structure wherein plural lines for connecting a magnetic head and a control circuit board to each other are formed on a thin metallic plate having spring properties so as to be integrated with the plate in the state that an insulating layer is interposed therebetween. For the thin metallic plate, which constitutes the substrate of the suspension (flexure), a flexible metal, such as SUS, is used to cause the plate to function as a spring when the suspension is used. However, the thin metallic plate, which functions as a spring besides as a base, does not fulfill any especial function other than these functions. Accordingly, if some additional function can be supplied to the thin metallic plate, the resultant magnetic head suspension is convenient. Besides, if the supply can easily be attained, the magnetic head suspension is especially convenient.

In light of the situation, the present invention has been made. An object thereof is to provide a magnetic head suspension wherein a thin metallic plate as a substrate is caused to have a new function besides a function as a spring.

Means for Solving the Problems

The present invention provides a magnetic head suspension (an invention according to claim 1), in which plural lines for connecting a magnetic head and a control circuit board to each other are formed over a thin metallic plate having a spring property through an insulating layer, and are integrated with the thin metallic plate, characterized in that a metallic pad made of a same metal layer as the plural lines is formed independently of the lines, an opening is made in a portion of the metallic pad to penetrate the insulating layer and then reach the thin metallic plate, and an electroconductive region is formed into the opening by metal plating, thereby connecting the metallic pad and the thin metallic plate electrically to each other.

The present invention further provides a magnetic head suspension (an invention according to claim 2, which is the magnetic head suspension according to claim 1), characterized in that the metallic pad is formed adjacently to a mounting section for a magnetic head slider, and a connecting section for connecting to the magnetic head slider is formed to the metallic pad.

The present invention also provides a magnetic head suspension (an invention according to claim 3, which is the magnetic head suspension according to claim 1), characterized in that the metallic pad is formed in a portion of a ground line for restraining interference of signals passing in the lines.

EFFECT OF THE INVENTION

In the magnetic head suspension which is an invention according to claim 1, a metallic pad made of the same metal layer as the plural lines is formed independently of the lines, an opening is made in a portion of the metallic pad to penetrate an insulating layer to reach a thin metallic plate, and an electroconductive region is formed into the opening by metal plating, thereby connecting the metallic pad and the thin metallic plate electrically to each other. Therefore, the suspension can have a new function that its desired portions can be earthed through its simple structure without adopting a complicated structure, wherein additional special lines for earthing are not separately laid besides the above-mentioned lines, which are lines for connecting a magnetic head and a control circuit board to each other. The metallic pad (a kind of connecting terminal) is connected to the thin metallic plate at the electroconductive region, which is formed by the metal plating, thus, in this case, the connection resistance can be made lower than in a case where such connection is attained by effect of an electroconductive paste.

The magnetic head suspension which is an invention according to claim 2 is the magnetic head suspension according to claim 1 wherein the metallic pad is formed adjacently to a mounting section for a magnetic head slider, and a connecting section for connecting to the magnetic head slider is formed to the metallic pad. Therefore, when the connecting section is connected to the ground of the magnetic head slider, electric charges collected in the magnetic head slider can be released to the thin metallic plate. Thus, an antistatic measure can easily be taken.

The magnetic head suspension which is an invention according to claim 3 is the magnetic head suspension according to claim 1 wherein the metallic pad is formed in a portion of a ground line for restraining interference of signals passing in the lines. Thus, it is unnecessary that the ground line is laid along the lines up to the end so as to be connected to the earth. As a result, the ground line is laid on a necessary region, and through this simple structure, signals can be made stable.

| Description of Reference Numbers | |
|---|---|
| 1: | thin metallic plate |
| 2: | insulating layer |
| 3: | lines |
| 4: | platform |
| 5: | mounting section |
| 6: | metallic pad |
| 6a: | connecting section |
| 7: | metallic layer |
| 8: | opening |
| 9: | electroconductive region |
| 10: | ground line |
| 10a: | metallic pad |
| 11: | thin metallic plate |
| 12: | insulating layer |
| 13: | electroconductive layer |
| 14 and 15: | resists |
| 16 and 17: | resists |
| 18: | opening |
| 19: | wiring plating |
| 20 and 21: | resists |
| 22: | electroconductive regions |

BEST MODE FOR CARRYING OUT THE INVENTION

The present invention will be described in detail on the basis of illustrated embodiments hereinafter.

First Embodiment

Figure 1:
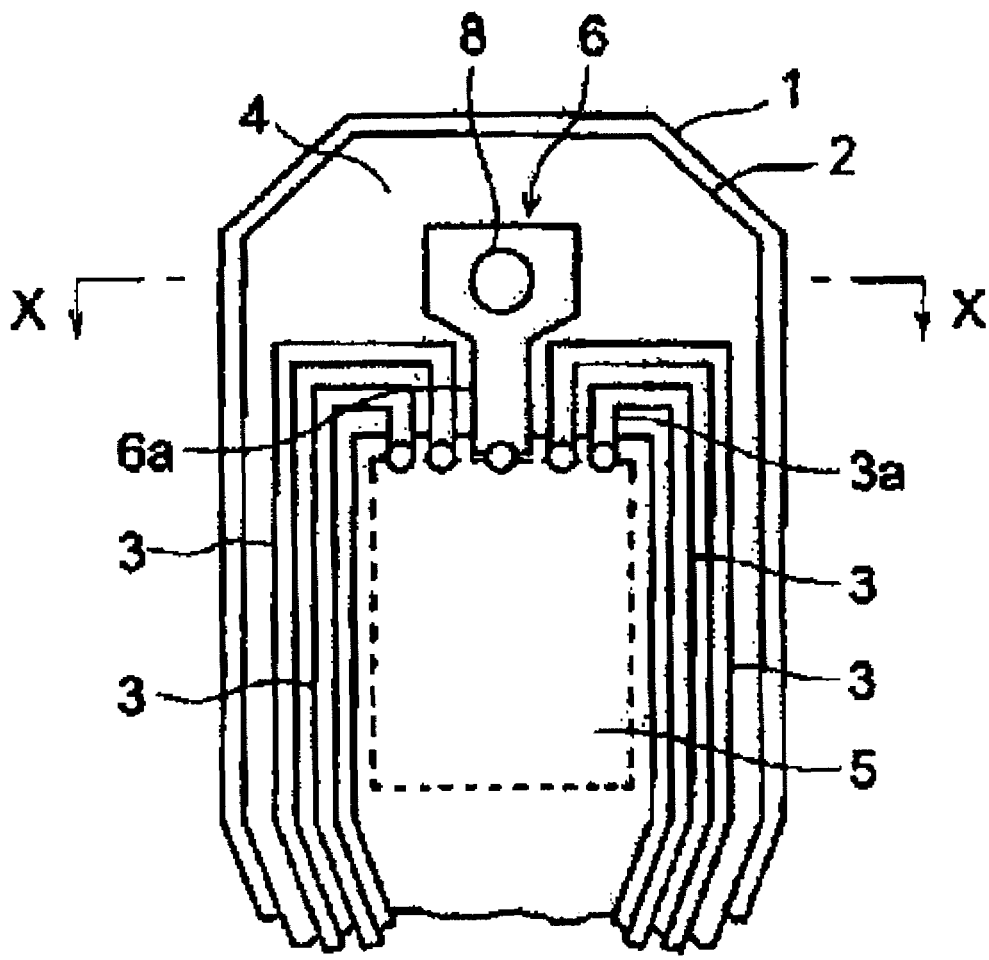
FIG. 1 is a view illustrating an example of a first embodiment of the present invention, and is an enlarged plan view illustrating a tip portion of a magnetic head suspension, on which a magnetic head slider is mounted.
Figure 2:
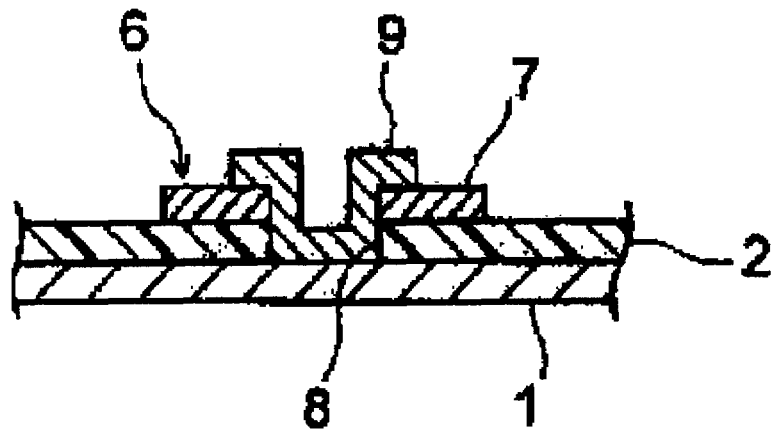
FIG. 2 is an X-X sectional view of FIG. 1.

FIG. 1 is a view illustrating an example of a first embodiment of the present invention, and is an enlarged plan view illustrating a tip portion of a magnetic head suspension, on which a magnetic head slider is mounted. FIG. 2 is an X-X sectional view of FIG. 1.

The magnetic head suspension has a structure wherein four lines 3, in a pattern form, made of Cu, are formed on SUS, which works as a thin metallic plate 1, having spring properties to be integrated with the plate 1 in the state that a polyimide, which works as an insulating layer 2, is interposed therebetween. Gold plating is applied, as wiring plating, onto the individual lines 3 ordinarily over the whole thereof.

The four lines 3 illustrated in FIG. 1 are lines for connecting a magnetic head and a control circuit board to each other. For example, two lines on the right side of the figure, out of the lines 3, are lines for a writing magnetic head element and the other two lines, on the left side thereof, are lines for a reading magnetic head element. The twos out of these lines 3 each constitute a pair, and the pair extends from the root side of the suspension toward the tip portion, and is substantially orthogonally curved at a platform 4. Furthermore, the pair is again substantially orthogonally curved toward a mounting section 5 for a magnetic head slider. In single-ends of the individual curved lines 3, the following are formed: connecting sections 3a, for wiring, connected through solder to four connecting sections, respectively, fitted to the tip side of the magnetic head slider.

In the magnetic head suspension in FIG. 1, a metallic pad 6 is formed in the platform 4 adjacent to the mounting section 5 for the magnetic head slider, and the metallic pad 6 is equipped with a connecting section 6a which passes between the two right lines 3 and the two left lines 3 and attains connection to the ground of the magnetic head slider. As illustrated in FIG. 2, this metallic pad 6 is made of the same metallic layer 7 as the lines 3, but is formed independently of the lines 3. An opening 8 is made in a portion of this metallic pad 6, which is in an island form, to penetrate the insulating layer 2 and then reach the thin metallic plate 1. An electroconductive region 9 is formed in the opening 8 by metal plating. In this way, the metallic pad 6 and the thin metallic plate 1 are electrically connected to each other. Examples of the metal used in the metal plating for this electroconductive region 9 include Ni, Cu, Au and Ag.

In the case of Ni plating, such an electroconductive region based on metal plating makes it possible to connect the thin metallic plate and the metallic pad electrically to each other with low resistance values of 0.25 Ω or less, and 0.20 Ω or less when the diameter of the opening is 100 μm and 200 μm, respectively, as shown in Table 1. The resistance value of each electroconductive region shown in Table 1 is a value obtained by measuring the electroconductive region and the thin metallic plate near the opening with a four-terminal tester. This resistance value includes the contact resistance between it and a measuring terminal on the SUS surface.

TABLE 1

Resistance value (Ω) of electroconductive region based on Ni plating

| | Diameter of opening | |
|---|---|---|
| Sample Nos. | 100 μm | 200 μm |
| 1 | 0.25 Ω | 0.19 Ω |
| 2 | 0.23 Ω | 0.20 Ω |
| 3 | 0.21 Ω | 0.18 Ω |
| 4 | 0.23 Ω | 0.17 Ω |
| 5 | 0.19 Ω | 0.18 Ω |

According to the magnetic head suspension having this structure, electric charges stored in the magnetic head slider can be released to the side of the thin metallic plate 1 by connecting the connecting section 6a of the metallic pad 6 to the ground of the magnetic head slider. The connection at this time is attained by GBB (gold ball bonding) or SBB (solder ball bonding).

Recently, demands for HDDs to be mounted onto various small-sized devices, typical examples thereof including portable devices, have been increasing, thus, the density of the HDDs has been made high, and further the size of magnetic heads has been becoming small. The magnetic heads have been more easily affected by electrostatic charging as the sensitivity of the magnetic heads has been made higher. Accordingly, the property of a small-sized magnetic head element is changed by electric charges stored in its slider. At worst, that the risk of breaking the element is large. Conventionally, the magnetic head slider is earthed by use of electroconductive paste when the slider is mounted on SUS. However, the adoption of a structure as described above makes the electric resistance lower than the adoption of electroconductive paste. Additionally, the slider itself can be fixed with an inexpensive adhesive, therefore, electrical reliability can be surely kept at low costs.

It can be earthed to the thin metallic plate at any location thereof. Thus, the present invention has an advantage that the flexibility of design is improved. For example, the metallic pad 6 may be formed at a site adjacent to the rear of the mounting section 5 for the magnetic head slider. In other words, the metallic pad 6 may be formed to cause the connecting section 6a to face the mounting section 5 on a side opposite to the side illustrated in FIG. 1. Such an arrangement of the metallic pad 6 makes it possible to fix, without using any adhesive sheet or bonding paste, the magnetic head slider at the same time when the connecting section 6a is connected to the ground.

Second Embodiment

Figure 3:
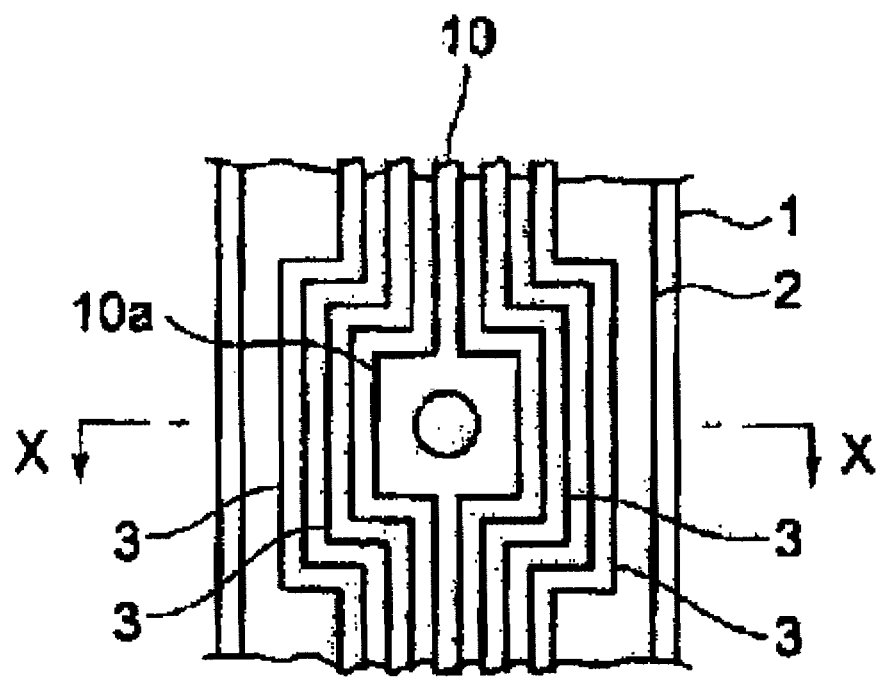
FIG. 3 is a view illustrating an example of a second embodiment of the present invention, and is an enlarged plan view illustrating a middle portion of a magnetic head suspension, through which lines passes.
Figure 4:
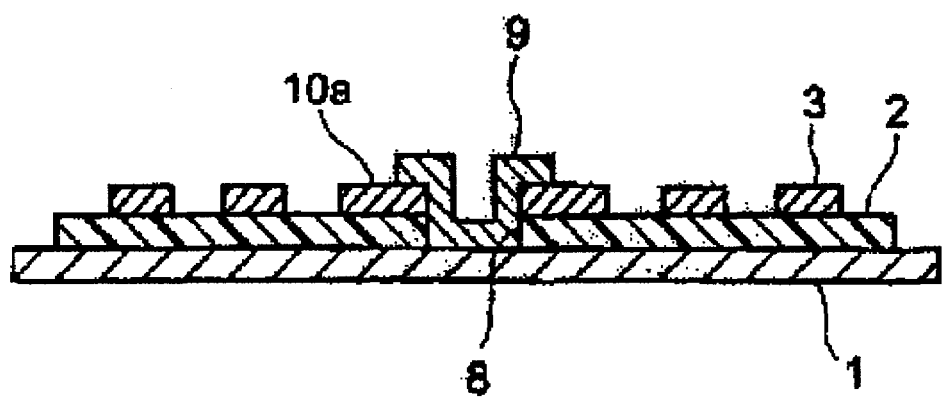
FIG. 4 is an X-X sectional view of FIG. 3.

FIG. 3 is a view illustrating an example of a second embodiment of the present invention, and is an enlarged plan view illustrating a middle portion of a magnetic head suspension, through which lines passes. FIG. 4 is an X-X sectional view of FIG. 3.

This magnetic head suspension has a structure wherein four lines 3, in a pattern form, made of Cu are formed on SUS, which works as a thin metallic plate 1, having spring properties to be integrated with the plate 1 in the state that a polyimide, which works as an insulating layer 2, is interposed therebetween. Gold plating is applied, as wiring plating, onto the individual lines 3 ordinarily over the whole thereof. In FIG. 4, the wiring plating is omitted.

The four lines 3 illustrated in FIG. 3, which are other than the center, are lines for connecting a magnetic head and a control circuit board to each other. For example, two lines on the right side of the figure, out of the lines 3, are lines for a writing magnetic head element and the other two lines, on the left side thereof, are lines for a reading magnetic head element. In this magnetic head suspension in FIG. 3, a ground line 10 for restraining interference of signals passing in the lines 3 is laid between the twos of the lines 3. A metallic pad 10a is formed in a portion of the line 10. As illustrated in FIG. 4, this metallic pad 10a is made of the same metallic layer as the lines 3, but is formed independently of the lines 3. An opening 8 is made in a portion of this metallic pad 10a, in which a portion of the ground line 10 is enlarged, to penetrate the insulating layer 2 and then reach the thin metallic plate 1. An electroconductive region 9 is formed in the opening 8 by metal plating. In this way, the metallic pad 10a and the thin metallic plate 1 are electrically connected to each other. Examples of the metal used in the metal plating for this electroconductive region 9 include Ni, Cu, Au and Ag, as described above.

According to the magnetic head suspension having this structure, interference between both signals is restrained by laying the ground line 10 between the writing lines 3 and the reading lines 3 laid on the insulating layer 2. Thus, the signals can be made stable. Conventionally, a ground line 10 is laid along lines 3 up to the rear end of a suspension, and further the line 10 is connected to the earth. However, the setting of the above-mentioned metallic pad 10 makes it possible to restrain noises easily onto signals passing in the lines 3 when the thin metallic plate 1 is connected to the earth common to the plate 1 and the control circuit. Moreover, when the thin metallic plate 1 is connected to the earth common to the plate 1 and the control circuit, common earthing can be attained through the plate 1 without laying any ground line common to the control circuit board and the plate 1. As a result, the arrangement of lines, or the like is easily designed. In other words, ground lines are laid only in necessary regions, about each of the ground lines, the electroconductive region 9 based on plating can be formed in the thin metallic plate 1. For this reason, the following form may be adopted: a form in which ground lines are laid on both side of a line, or a form in which ground lines are laid in positions apart from each other.

The above has described the two embodiments of the magnetic head suspension according to the present invention. Processes for producing them are basically equal to each other. With reference to process charts of FIGS. 5 to 7, the production process thereof will be described hereinafter. FIGS. 5 to 7 each illustrate a situation that lines are formed by the right half thereof and a situation that a metallic pad is formed by the left half thereof.

Figure 5A:
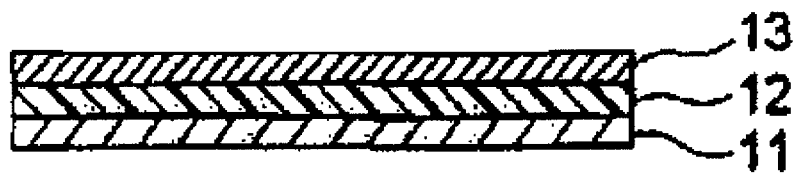
FIGS. 5A to 5D are process charts of a first stage of a production of a magnetic head suspension for the present invention.
Figure 5B:
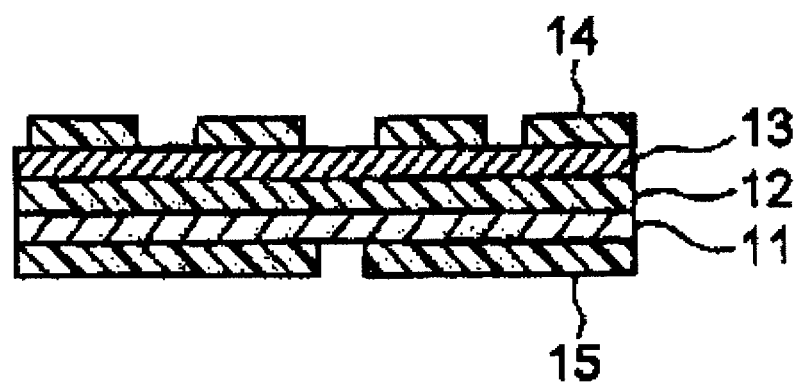
Figure 5C:
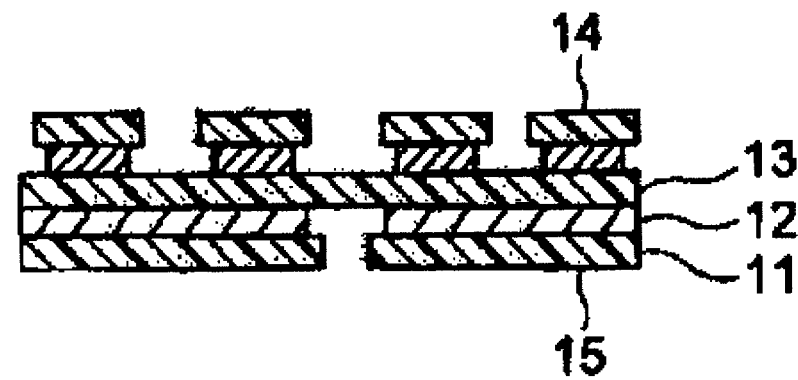
Figure 5D:
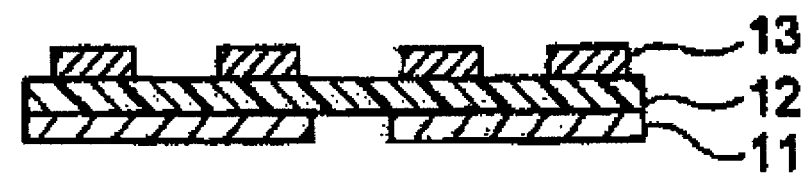

Prepared is a laminate plate illustrated in FIG. 5A, that is, a laminate plate comprising: SUS as a thin metallic plate 11 having spring properties, a polyimide as an insulating layer 12, and Cu as an electroconductive layer 13. First, the thin metallic plate 11, which is a metallic member, and the electroconductive layer 13 are etched so as to be patterned. Specifically, as illustrated in FIG. 5B, resists such as dry films are laid on both surfaces of the laminate, respectively. They are each patterned into a predetermined form. Thereafter, as illustrated in FIG. 5C, the workpiece is etched from both surfaces thereof. Next, the resists, which are resists 14 and 15, are peeled off, as illustrated in FIG. 5D.

Figure 6A:
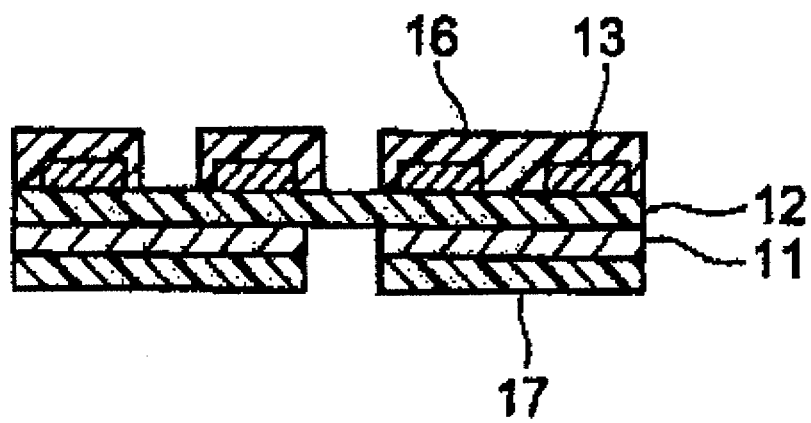
FIGS. 6A to 6C are process charts of a second stage of the production of the magnetic head suspension for the present invention.
Figure 6B:
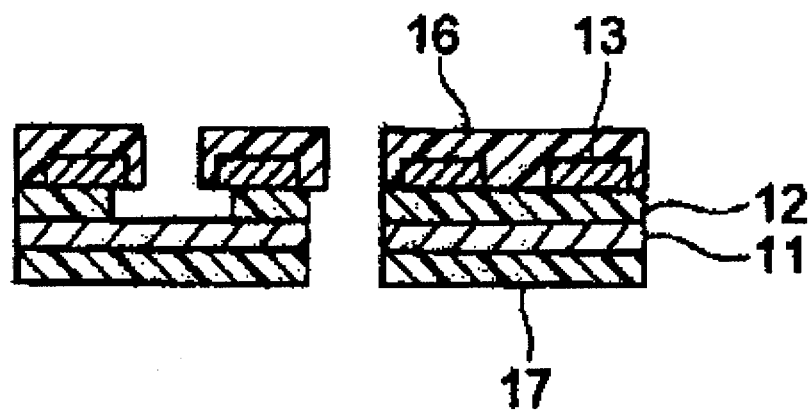
Figure 6C:
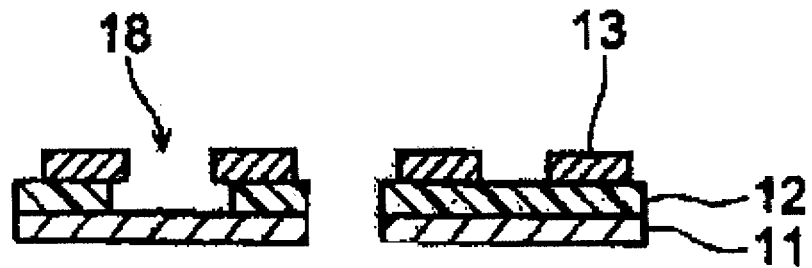

Subsequently, the insulating layer 12, which is located in the middle, is etched so as to be patterned. Specifically, as illustrated in FIG. 6A, resists 16 and 17, such as dry films, are laid to cover the patterned thin metallic plate 11 and electroconductive layer 13, and they are each patterned into a predetermined form. Thereafter, as illustrated in FIG. 6B, the electroconductive layer 13 is etched from both surfaces thereof. As illustrated in FIG. 6C, the resists 16 and 17 are then peeled off. In this way, in the metallic pad, an opening 18 is made which penetrates the insulating layer 12 to reach the thin metallic plate 11.

Figure 7A:
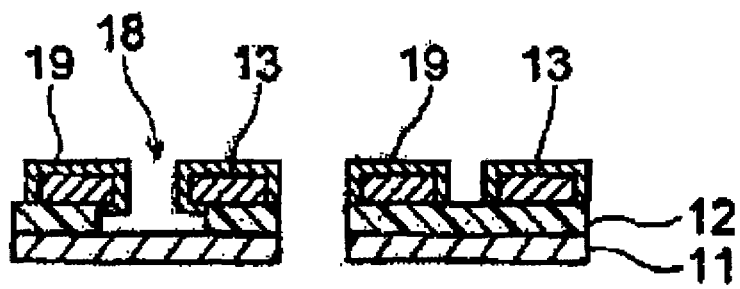
FIG. 7A to 7D are process charts of a third stage of the production of the magnetic head suspension for the present invention.
Figure 7B:
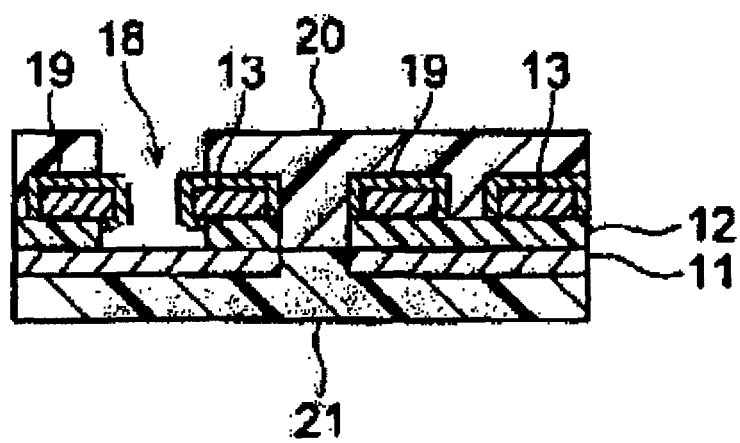
Figure 7C:
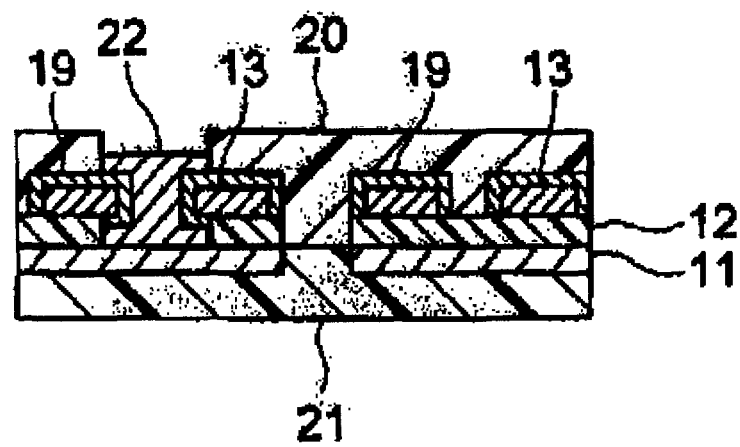
Figure 7D:
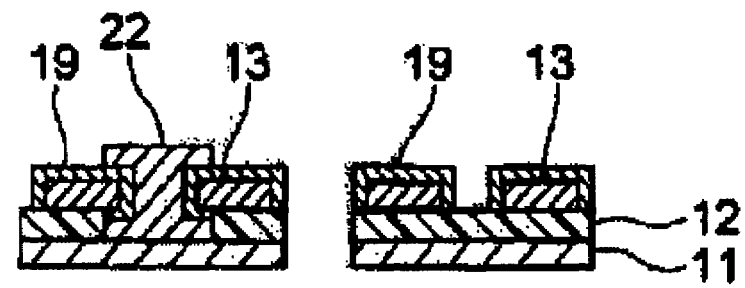

Next, a sparger and the like are used to conduct a plating step two times, thereby forming wiring plating and electroconductive regions. Specifically, as illustrated in FIG. 7A, a wiring plating 19, such as gold plating, is applied onto the electroconductive layer 13 including the metallic pad, and then resists 20 and 21, such as dry films, are laid on both surfaces thereof, respectively. As illustrated in FIG. 7B, the resist 20 on the wiring side is patterned to exclude the opening 18 in the metallic pad. As illustrated in FIG. 7C, metal plating is then applied to the workpiece to form an electroconductive region 22. As illustrated in FIG. 7D, the resists 20 and 21 are peeled off. In this way, the metallic pad and the thin metallic plate 11 are electrically connected to each other through the electroconductive region 22. In this step, the wiring plating 19 is applied also to the electroconductive layer 13 of the metallic pad. However, this is not necessarily required. Finally, a protecting cover layer is optionally laid on the wiring lines.

The above has described the embodiments of the present invention in detail, however, the magnetic head suspension of the present invention is not limited to the embodiments. The embodiments may be variously modified as far as the modifications do not depart from the subject matter of the present invention.

The invention claimed is:

1. A magnetic head suspension, in which plural lines for connecting a magnetic head and a control circuit board to each other are formed over a thin metallic plate having a spring property through an insulating layer, and are integrated with the thin metallic plate, wherein
- a metallic pad made of a same metal layer as the plural lines is formed independently of the lines,
- an opening is made in a portion of the metallic pad to penetrate the insulating layer and then reach the thin metallic plate,
- an electroconductive region is formed into the opening by Ni plating, thereby connecting the metallic pad and the thin metallic plate electrically to each other, and
- a resistance value of the electroconductive region for connecting the metallic pad and the thin metallic plate electrically to each other is from 0.17 Ω to 0.25 Ω.

2. The magnetic head suspension according to claim 1, wherein the metallic pad is formed adjacently to a mounting section for a magnetic head slider, and a connecting section for connecting to the magnetic head slider is formed to the metallic pad.

3. The magnetic head suspension according to claim 1, wherein the metallic pad is formed in a portion of a ground line for restraining interference of signals passing in the lines.

4. The magnetic head suspension according to claim 2, wherein the metallic pad is formed at a site adjacent to a front of the mounting section for the magnetic head slider.

5. The magnetic head suspension according to claim 2, wherein the metallic pad is formed at a site adjacent to a rear of the mounting section for the magnetic head slider.

6. The magnetic head suspension according to claim 3, wherein a ground line is provided between two writing lines and two reading lines.

7. The magnetic head suspension according to claim 1, wherein a diameter of the opening, to which the Ni plating is applied, is from 100 μm to 200 μm.

8. A process for producing a magnetic head suspension, comprising at least following steps of:
- a step of preparing a laminate plate, in which a thin metallic plate and an electroconductive layer are bonded to each other through an insulating layer,
- a step of patterning the thin metallic plate and the electroconductive layer by etching,
- a step of patterning the insulating layer into a predetermined form by etching, thereby making an opening in a metallic pad,
- a step of covering the thin metallic plate and the electroconductive layer with an insulating film in their regions other than the opening for connecting the thin metallic plate and the electroconductive layer electrically to each other, and
- a step of using the thin metallic plate as a power-feeding layer to conduct metal plating, thereby connecting the thin metallic plate and the metallic pad of the electroconductive layer electrically to each other.

9. The process for producing a magnetic head suspension according to claim 8, wherein the metallic pad is formed adjacently to a mounting section for a magnetic head slider, and a connecting section for connecting to the magnetic head slider is formed to the metallic pad.

10. The process for producing a magnetic head suspension according to claim 8, wherein the metallic pad is formed in a portion of a ground line for restraining interference of signals passing in the lines.

11. The process for producing a magnetic head suspension according to claim 9, wherein the metallic pad is formed at a site adjacent to a front of the mounting section for the magnetic head slider.

12. The process for producing a magnetic head suspension according to claim 9, wherein the metallic pad is formed at a site adjacent to a rear of the mounting section for the magnetic head slider.

13. The process for producing a magnetic head suspension according to claim 10, wherein the ground line is provided between two writing lines and two reading lines.

14. The process for producing a magnetic head suspension according to claim 8, wherein the metal plating of an electroconductive region for connecting the metallic pad and the thin metallic plate electrically to each other is Ni plating.

15. The process for producing a magnetic head suspension according to claim 14, wherein a resistance value of the electroconductive region for connecting the metallic pad and the thin metallic plate electrically to each other is from 0.17 Ω to 0.25 Ω.

16. The process for producing a magnetic head suspension according to claim 8, wherein a diameter of the opening, to which the metal plating is applied, is from 100 μm to 200 μm.

* * * * *